United States Patent [19]
Gassman et al.

[11] Patent Number: 5,381,817
[45] Date of Patent: Jan. 17, 1995

[54] MECHANICAL FLEXURE FOR MOTION AMPLIFICATION AND TRANSDUCER WITH SAME

[75] Inventors: George W. Gassman; Warren G. Buchwald, both of Marshalltown; Douglas P. Gethmann, Gladbrook, all of Iowa; Nate F. Scarpelli, Glen Ellyn, Ill.

[73] Assignee: Fisher Controls Incorporated, Inc., Clayton, Mo.

[21] Appl. No.: 127,196

[22] Filed: Sep. 27, 1993

Related U.S. Application Data

[60] Division of Ser. No. 885,534, May 19, 1992, Pat. No. 5,265,637, which is a division of Ser. No. 723,698, Jun. 26, 1991, Pat. No. 5,163,461, which is a continuation of Ser. No. 554,339, Jul. 19, 1990, abandoned.

[51] Int. Cl.$^6$ ............................................. G05D 16/20
[52] U.S. Cl. .................. 137/82; 251/129.06; 251/129.08
[58] Field of Search ............... 137/82, 85; 251/129.06, 251/129.08

[56] References Cited

U.S. PATENT DOCUMENTS

| | | | |
|---|---|---|---|
| 2,018,384 | 10/1935 | Schoof | 33/147 |
| 2,139,251 | 12/1938 | Aller | 33/147 |
| 2,177,398 | 10/1939 | Aller | 74/469 |
| 2,419,061 | 4/1947 | Emery | 201/48 |
| 2,769,867 | 11/1956 | Crownover et al. | 179/110 |
| 2,778,232 | 1/1957 | Mork | 74/108 X |
| 2,887,294 | 5/1959 | Hahn | 251/129.06 |
| 2,904,735 | 9/1959 | Cullen et al. | 318/32 |
| 2,963,904 | 12/1960 | Dillon, Sr. | 73/141 |
| 2,992,373 | 7/1961 | Golding | 318/28 |
| 3,024,648 | 3/1962 | Webster | 73/141 |
| 3,151,693 | 10/1964 | Chapman | 177/234 |
| 3,174,716 | 3/1965 | Salter | 251/129 |
| 3,218,445 | 11/1965 | Fluegel | 235/194 |
| 3,370,458 | 2/1968 | Dillon | 73/141 |
| 3,414,010 | 12/1968 | Sparrow | 251/129.06 X |
| 3,638,481 | 2/1972 | Wilner | 73/141 |
| 3,848,462 | 11/1974 | McIlrath | 73/88.5 |
| 4,025,942 | 5/1977 | Kurtz | 357/26 |
| 4,158,368 | 6/1979 | Clark | 137/487.5 |
| 4,340,083 | 7/1982 | Cummins | 25/129.06 X |
| 4,701,660 | 10/1987 | Baumgartner | 310/338 |
| 4,748,858 | 6/1988 | Ort | 73/862.63 |
| 4,926,896 | 5/1990 | Prescott | 137/82 |
| 4,934,401 | 6/1990 | Ikehata et al. | 251/129.06 X |

OTHER PUBLICATIONS

Butler, J. L., "Application Manual for the Design of Etrema TERFENOL-D ™ Magnetostrictive Transducers," Edge Technologies, Inc. (1988).

Geary, P. J., "Flexure Devices," British Scientific Instruments, 1954, 9 article pages.

Primary Examiner—John Rivell
Attorney, Agent, or Firm—Marshall, O'Toole, Gerstein, Murray & Borun

[57] ABSTRACT

A mechanical flexure element useful for motion amplification with a closed end and two legs extending therefrom in a general U-shaped configuration. One leg may be fixed and the other leg moved, or both legs may be movable with respect to each other. Microdisplacements of a leg are amplified and translated into larger transverse movements of the closed end. Reversing the input and output displacements provides attenuation of a larger input displacement. A magnetostrictive electromechanical transducer with a flexure element having a closed end and two legs extending therefrom moving towards and away from a nozzle in an enclosed nozzle chamber under fluid pressure. An electrical input signal actuates a magnetostrictive element coupled to one leg of the flexure element to move the element with respect to the nozzle thereby changing the fluid output pressure from the nozzle chamber. Diaphragm means are coupled to the moving leg of the flexure element and responsive to the changing pressure in the nozzle chamber to provide a feedback force until the final fluid output pressure is proportional to the electrical input signal.

2 Claims, 4 Drawing Sheets

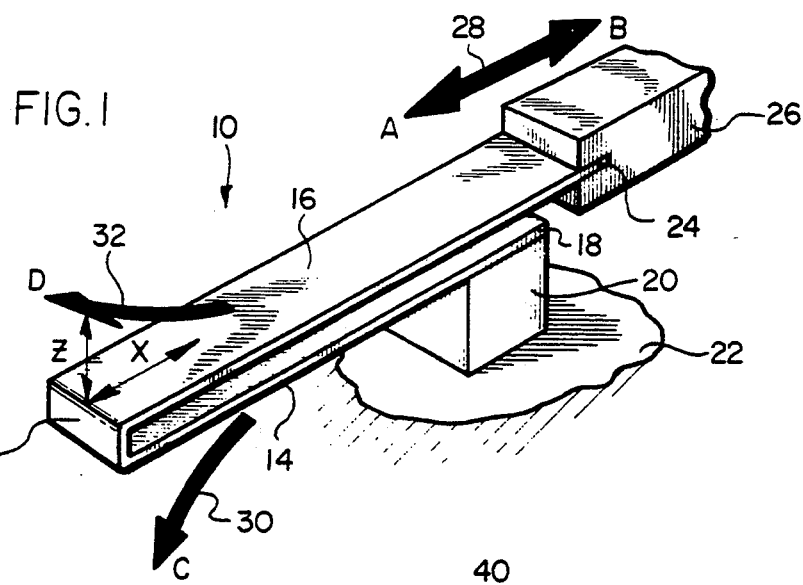
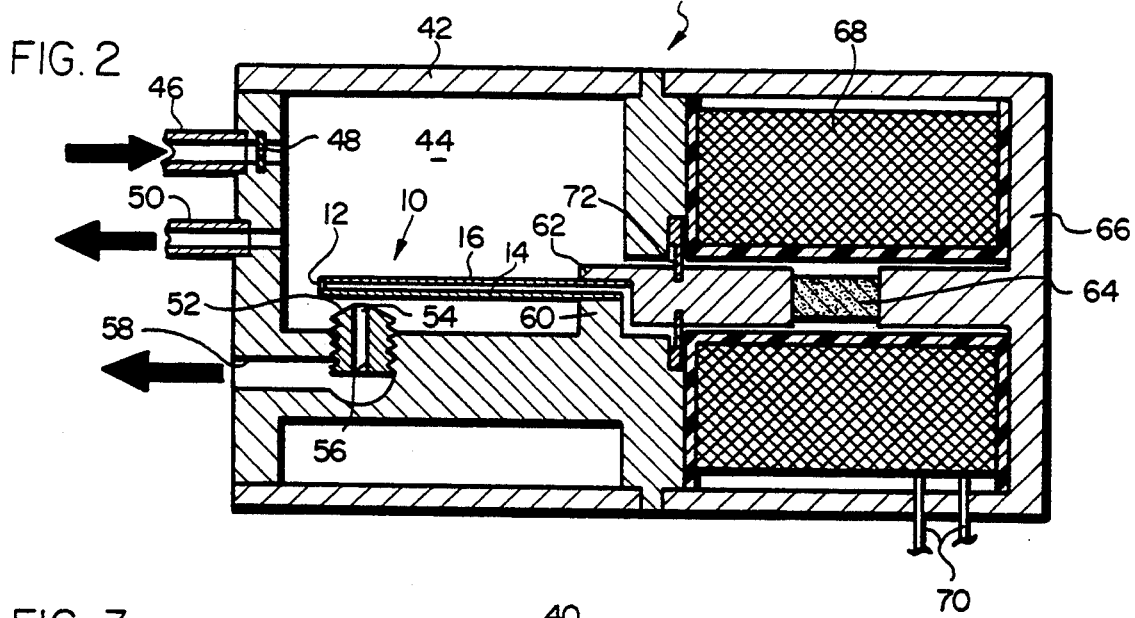
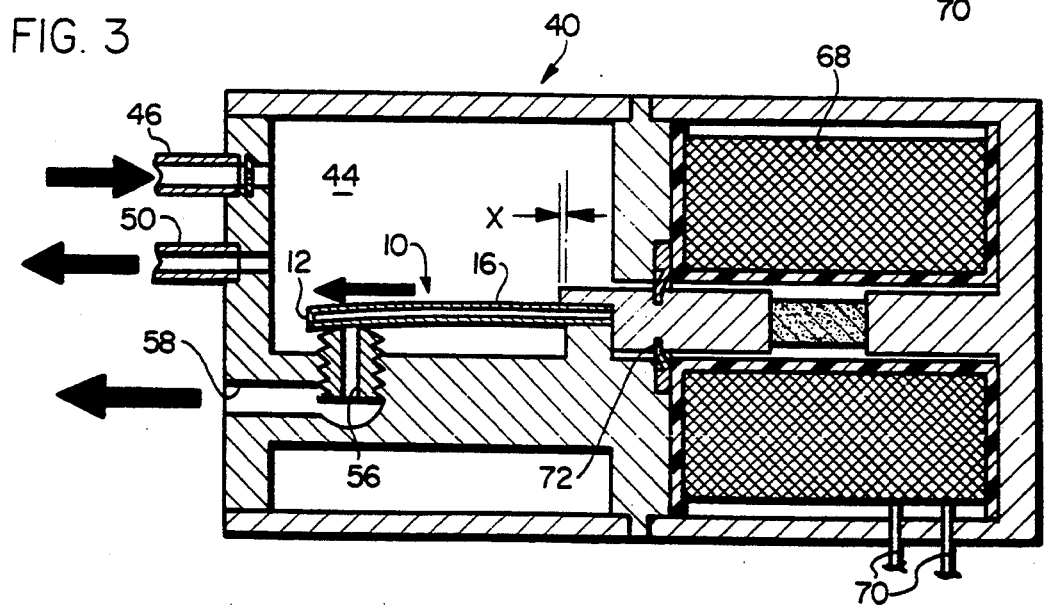

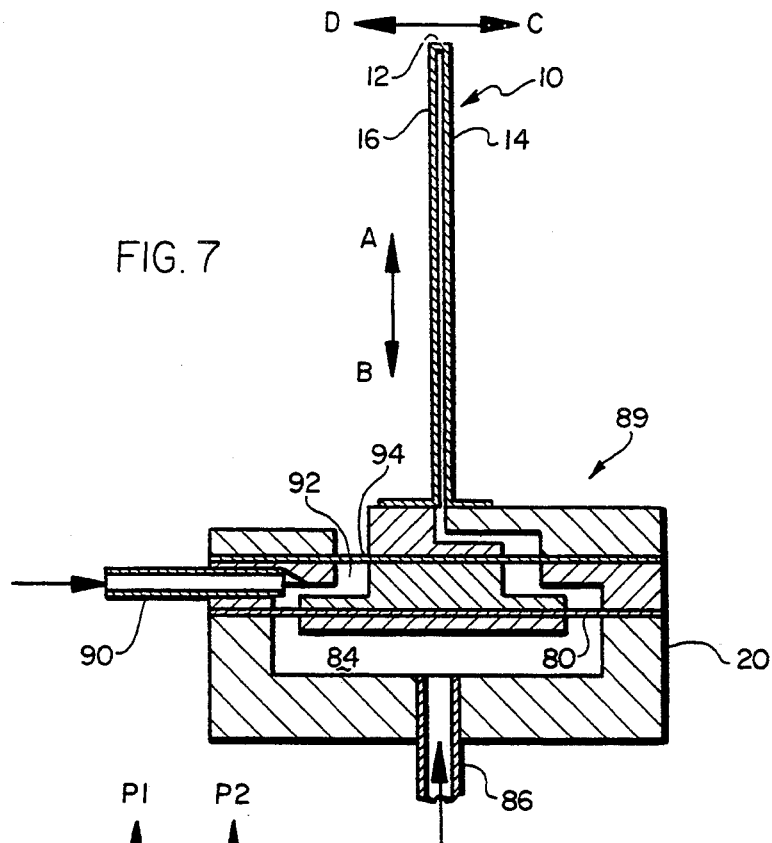
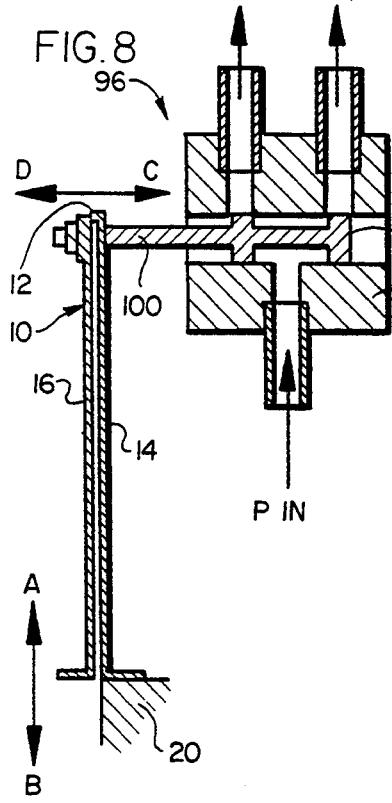
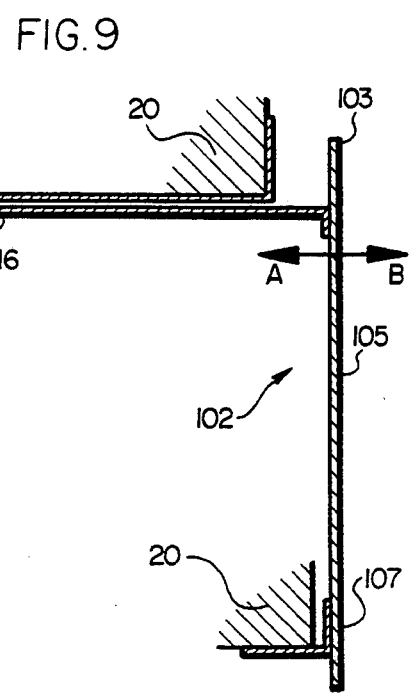

MECHANICAL FLEXURE FOR MOTION AMPLIFICATION AND TRANSDUCER WITH SAME

This is a divisional of U.S. application Ser. No. 07/885,534, filed May 19, 1992, U.S. Pat. No. 5,265,637, which is a divisional of Ser. No. 07/723,698, filed Jun. 26, 1991, U.S. Pat. No. 5,163,461, which is a continuation of U.S. Ser. No. 07/554,339, filed Jul. 19, 1990, abandoned.

This invention relates to a mechanical flexure element for motion amplification and to electromechanical transducer devices incorporating such a mechanical flexure element.

BACKGROUND OF THE INVENTION

Reference may be made to the following U.S. patents of interest concerning mechanical flexure elements: U.S. Pat. Nos. 4,748,858; 3,638,481; 3,370,458; 3,151,693; 3,848,462; 2,963,904.

In many applications, it is desired to provide a flexure element that can be used to amplify or increase small motions into larger motions. One example of such a desirable use for such a device is in instrumentation where for example a sensing element is subjected to or undergoes a slight displacement which is to be detected to provide a motion indication or a quantitative motion measurement. Such motion amplification devices are extremely desirable for example for use with piezoelectric, magnetostrictive, or electrostrictive elements, and other such types of transducers in the detection or sensing of very small displacements in the micron range, i.e., micro-meter range.

Present motion amplification devices such as lever mechanisms suggested for micro-meter range sensing have major drawbacks in certain areas such as reaction to temperature changes, fragile structure, low motion amplification, high lost motion characteristics, high hysteresis losses, or costly materials or method of manufacturing. Accordingly, it is desired to provide a mechanical flexure which can be sized to amplify very small, micron displacements generated for instance by magnetostrictive, electrostrictive and piezoelectric elements, so as to be adaptable for use in practical actuator and transducer units and which desirable flexure element provides the following advantages over conventional lever mechanisms: (1) simple, low-cost structure and method of manufacture; (2) providing high amplification ratio for very small displacements; (3) significantly reduced lost motion characteristics; (4) very linear for small displacements; (5) low hysteresis; (6) low sensitivity to temperature changes; and (7) rugged, reliable structure with long lasting performance.

Reference may also be made to the following U.S. patents of interest with respect to electromechanical transducers: U.S. Pat. Nos. 4,701,660; 4,158,368; 4,025,942; 3,370,458; 3,218,445; 2,992,373; 2,904,735; 2,769,867; 2,419,061; and to the publication, "Application Manual For The Design of Etrema TERFENOL-D ™ Magnetostrictive Transducers", J. L. Butler, Edge Technologies, Inc. 1988.

Electromechanical transducers have been used for many years to transform, for instance, electrical signals into a mechanical motion, and vice versa. Such transducers find application in a variety of circumstances, including fluid flow control devices, fluid flow indicating and measuring devices, etc. A particular need is desired for a reliable electromechanical transducer which can respond to very small electrical signals to provide micro-motion in a transducer element or a moving member connected to the transducer element. Prior electromechanical transducers have utilized piezoelectric substances, Rochelle salt, or electrostrictive materials, such as polycrystalline ceramics.

Recently, in the desire to obtain more sensitive and faster acting electromechanical transducers, the introduction of magnetostrictive materials to such transducers has been proposed, such as is disclosed in the above indicated U.S. Pat. No. 4,158,368. This patent proposes the use of a magnetostrictive material with coupled members movable by the magnetostrictive material when placed in a magnetic field. Several embodiments are illustrated in this patent including, a valve plunger, a plate having apertures in another valve configuration, and two sliding plates with apertures selectively alignable in another valve configuration.

It is desirable to provide an electromechanical transducer for sensing and producing micro-motions in a more simple structural and operating configuration compared to prior suggested devices.

SUMMARY OF THE INVENTION

In accordance with one aspect of the present invention, there is provided a flexure element, made of metal, plastic, fiber or other similarly rigid material that can be used to amplify very small motions into larger motions and which provides all of the desired advantages over conventional lever mechanisms. According to the principles of the present invention, there is provided a flexure element having a closed end and two legs extending therefrom along respective longitudinal axes. Moving a first leg in longitudinal displacement with respect to the other through displacement means coupled to the first leg provides a larger amplified transverse displacement of the closed end with respect to the longitudinal axes.

As an example, one end of one leg may be fixedly mounted in position. Moving the other leg by for instance small longitudinal displacements generated by displacement means, such as magnetostrictive, electrostrictive or piezoelectric devices attached or coupled to the longitudinally moved leg enables the flexure or bender element to bend towards or away from the longitudinal axes which displaces the free closed end transversely to the longitudinal axes. Very small displacements of the moving leg, such as generated by the micron-sized displacements of a magnetostrictive device in response to a magnetic field, provides an amplified larger transverse movement of the free closed end of the flexure element. Thus, small longitudinal leg displacements are translated into much larger closed end displacements transverse to the longitudinal axis. Amplification ratios of 30/1 have been obtained in constructed embodiments of a bender element according to this invention.

A unique bender element in accordance with the present invention can be utilized in electromechanical transducers, such as a current to pressure transducer, in an electro-pneumatic relay, and in a control valve actuator. In particular, the flexural or bender element of the present invention provides a very simple, low-cost flexure device with a high amplification ratio, very linear output movements for small displacements, very low lost motion characteristics, low hysteresis, low sensitivity to temperature changes, and is rugged, reliable and capable of providing long lasting performance.

In another aspect of the present invention, there is provided an electromechanical transducer incorporating a bender device of the present invention. A current to pressure transducer is one embodiment of this invention, and includes a bender element to amplify micron-sized displacement from a magnetostrictive element. Current flowing through the coil of the magnetostrictive material causes the material to elongate. The motion of the magnetostrictive element is transmitted to the bender device, causing the free closed end of the bender device to move with greatly amplified motion.

The current to pressure transducer includes a nozzle chamber with the flexure or bender element mounted so as to control the fluid pressure passing from the nozzle chamber through the nozzle. Thus as the flexure element moves, pressure in the nozzle chamber may increase. This increased nozzle chamber pressure acts upon a feedback diaphragm attached to the flexure element and the magnetostrictive material to develop a compressive force which tends to restore the magnetostrictive material to its original length. When the feedback force exerted on the diaphragm equals the electrical input force generated through the magnetostrictive element, the resulting output pressure from the nozzle chamber is proportional to the magnetostrictive element coil input current.

Other forms of electromechanical transducers with the flexure or bender element of the present invention can be provided. Piezoelectric or electrostrictive elements can be utilized rather than a magnetostrictive element.

The flexure or bender element of this invention also can be used with other force or pressure elements, such as bellows, bourdon tubes, diaphragms, solenoids, voice coils, etc., for inducing small primary motions in a flexure leg which are translated and amplified into larger movements of the closed end of the flexure element. In addition to motion amplification, the flexure element also can be adapted for load amplification. Outputs with large motion displacements but low forces can be converted into outputs of high loading with small motion displacements.

Motions also can be attenuated using the flexure element. For instance, large displacement motions input to the flexure element closed end can be converted into extremely accurate small movements of a flexure leg suitable for precise object positioning, measurements, etc.

A flexure or bender device according to the invention may have one fixed leg and one movable leg, or may have both legs movable with respect to each other. Both embodiments, of course, utilize one leg movable in elongated displacement with respect to the other leg with resulting motion amplification and translation of the closed end of the bender device, or the reverse, i.e., large displacements of the closed end with a resulting attenuated motion displacement of one leg with respect to the other.

BRIEF DESCRIPTION OF THE DRAWINGS

The features of this invention which are believed to be novel are set forth with particularity in the appended claims. The invention may be best understood by reference to the following description taken in conjunction with the accompanying drawings, in which like reference numerals identify like elements in the several figures and in which:

FIG. 1 is a perspective view illustrating a flexure or bender device according to one aspect of the invention;

FIG. 2 is a schematic view illustrating a magnetostrictive electromechanical transducer utilizing the flexure device of FIG. 1 in one operating position;

FIG. 3 illustrates the magnetostrictive electromechanical transducer of FIG. 2 with the flexure device in a second operating position;

FIGS. 5–9 illustrate alternative applications utilizing the flexure device of FIG. 1;

DETAILED DESCRIPTION

Figure 4:
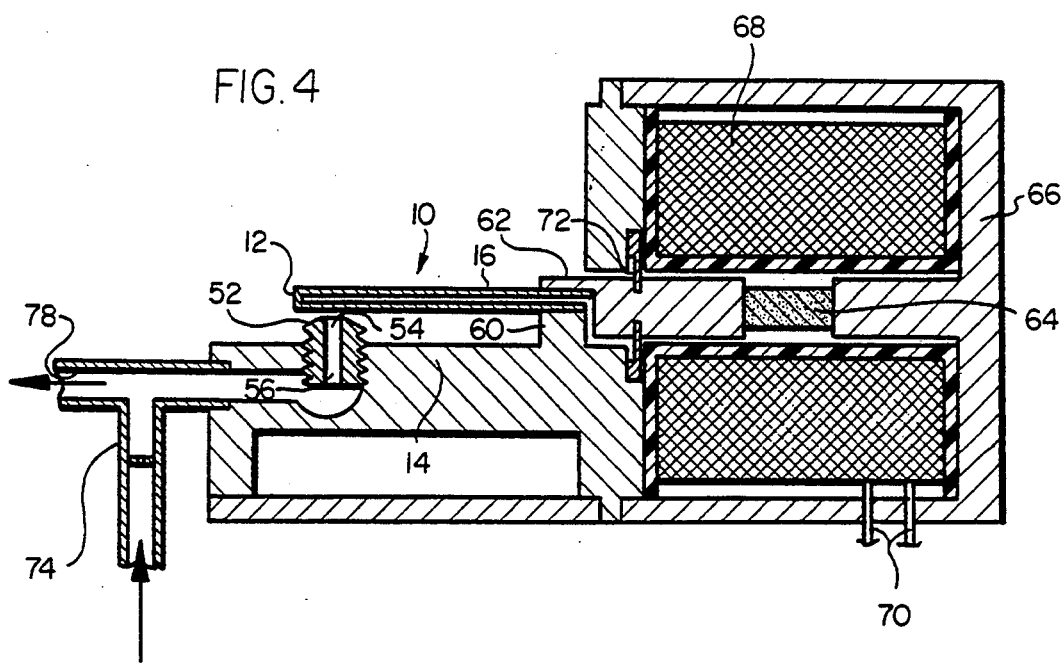
FIG. 4 illustrates an alternative electromechanical transducer embodiment.

Referring now to FIG. 1, there is illustrated a flexure element constructed in accordance with the present invention. Flexure or bender element 10 is formed of metal, plastic, fiber or other similarly rigid material into a member with closed end 12 and respective legs 14, 16 extending therefrom. End 18 of leg 14 is fixed in position such as schematically illustrated by a fixed mounting block 20 to a ground reference 22. End 24 of opposite leg 16 is mounted to a movable member 26 which can be a part of or connected to a magnetostrictive, electrostrictive or piezoelectric device or to a force or pressure element providing very small, micron-sized longitudinal displacements of leg 16.

It is to be understood that these types of movable members are given as examples, so that neither the type of movable member, the size of the flexure element, nor the amount of flexure element movement is to be taken as a limitation of the present invention.

Thus, for example, a magnetostrictive device or a bellows formed as movable member 26 can generate linear micro-displacements of leg 16 in the directions indicated by reference arrow 28. As one example, if a magnetostrictive member or a bellows formed as movable member 26 moves leg 16 in a linear displacement in direction A shown with respect to reference arrow 28, flexural element 10 will bend so that closed free end 12 will be displaced downwardly as indicated by direction C of reference arrow 30. Conversely, micro-motions of leg 16 in direction B of reference arrow 28 will bend free closed end 12 upwardly in direction D of reference arrow 32. Linear longitudinal displacements of leg 16 are therefore translated in amplified transverse displacements of closed end 12.

As shown in FIG. 1, micro-motions of leg 16 along longitudinal axis X are translated into larger motions of free, closed end 12 along the transverse axis Z. Motions of micron dimensions of leg 16 can result in 100–1000 microns movement of closed end 12 along axis Z. As an example of one embodiment of the present invention, flexural element 10 was constructed of type 304 stainless steel material having the following dimensions: flexure leg length—50.04 mm; flexure leg width—5.64 mm; each leg thickness—0.381 mm; and the legs being substantially adjacent each other over their length. With micro-motion displacement of leg 16 along longitudinal axis X amounting to 0.0254 mm, a corresponding translated displacement of free closed end 12 along transverse axis Z of 0.762 mm was obtained, thereby providing an amplification ratio of 30/1.

Rather than type 304 stainless steel, any other rigid type material with linear elastic characteristics may be utilized. Also, increasing the gap between legs 14, 16 tends to decrease the stiffness of the flexure element and thereby lessen the amount of force required for primary motion displacement of a moving leg. However, increasing the gap also tends to reduce the amplification gain of the flexure or bender device. On the other hand, while decreasing the gap increases the gain of the flexure element, this tends to increase the overall stiffness of the flexure element to input motion so that significantly more force is required to obtain primary motion displacement of a moving leg.

Accordingly, if a magnetostrictive element which is a high force, very small motion causing device is used as the primary motion displacement means for a flexure leg, it would be advantageous to utilize a smaller gap between legs 14, 16. Notice, for example, in FIG. 1 that the legs are closely adjacent each other generally in a tight, U-shaped configuration. Conversely, if a bellows element was used for primary motion displacement of the moving leg, the low force and high motion displacement output of the bellows may necessitate increasing of the gap between legs 14, 16. These reasoned choices can readily be made by those skilled in the art in accordance with the teachings herein of the flexure device of the present invention. It is to be understood therefore that the various dimensions, sizes and movement amounts described herein are for purposes of presenting a description of an embodiment of the invention and are not to be used to limit the scope of the invention.

Referring to FIGS. 2, 3, there is illustrated an electromechanical transducer in the form of a current to pressure transducer 40 including a flexure or bender element 10 as in FIG. 1. Transducer housing 42 includes an enclosed nozzle chamber 44 for containing fluid under pressure supplied through an inlet port 46 containing a primary restrictor 48. An outlet port 50 communicates with nozzle chamber 44 to provide a fluid output pressure from transducer 40.

A nozzle 52 is mounted in housing 42 with a control nozzle end 54 extending within nozzle chamber 44 and with an exhaust nozzle end 56 communicating nozzle chamber 44 with an exhaust port 58.

Flexure element 10 is cantilever mounted in nozzle chamber 44 with free closed end 12 above the control nozzle end. In particular, flexure element leg 14 is fixedly mounted to an abutment 60 to maintain flexure element 10 in the position shown in FIG. 2. Leg 16 is connected to a movable magnetic core 62 at one end and with the other end of core 62 being connected to a magnetostrictive rod 64 which in turn has its opposite end mounted to magnetic housing 66.

Within magnetic housing 66, there is included a coil 68 surrounding magnetostrictive rod 64 with the opposite coil ends connected to respective connecting wires 70 for receiving an electrical current. Magnetostrictive rod 64 can be formed of magnetostrictive material which responds to a magnetic field produced by current flowing in coil 68 to induce a strain in the magnetostrictive material and thereby elongate the material.

Such magnetostrictive material is well known and is normally formed of alloys of rare earth elements with iron. Presently available rare earth magnetostrictive materials produce large strains up to approximately 2.000 ppm (parts per million) for an imposed magnetic field as a result of a current in surrounding coil 68. In particular, it is preferred that rod 64 be formed of a magnetostrictive material sold with the trademark "TERFENOL-D", which is currently available from Edge Technologies, Inc. of Ames, Iowa.

One end of nozzle chamber 44 is sealed by means of a flexible feedback diaphragm 72 which in turn is mounted to movable magnetic core 62. Thus, enclosed nozzle chamber 44 within housing 42 has openings through inlet port 46, outlet port 50 and exhaust port 58 and is sealed at the opposite end by means of a flexible diaphragm 72. The outer perimeter of diaphragm 72 is mounted to housing 42 and the inner perimeter is mounted into movable magnetic core 62. Feedback diaphragm 72 may be constructed of a thin metal material such as type stainless steel.

Electromechanical transducer 40 transforms electrical energy in the form of an electrical current supplied to wires 70 into mechanical energy in the form of fluid pressure supplied from fluid outlet port 50. Such a transducer is particularly useful in for instance an electronic control loop where the final control element, generally a control valve, is pneumatically operated. Typically, the transducer receives a milliampere of direct current input signal such as on wires 70 and transmits a proportional pneumatic output pressure on output port 50 to a final control element which may control the flow of fluid in a fluid pipeline system.

In the operation of the present invention illustrated in FIGS. 2, 3, an electrical current supplied to wires 70 and flowing in coil 68 produces a magnetostrictive strain in the magnetostrictive material forming magnetostrictive rod 64 so as to elongate rod 64 and transmit this micro-motion through feedback diaphragm 72 and movable magnetic core 62 to leg 16 of bender 10. This linear micro-motion displacement of leg 16 causes free closed end 12 of the flexure element move toward control nozzle end 54 with a greatly amplified motion as shown in FIG. 3.

As flexure element 10 moves toward nozzle 52, the fluid flow out exhaust nozzle end 56 and exhaust port 58 is restricted thereby resulting in an increase in fluid pressure in nozzle chamber 44. The increased nozzle pressure in nozzle chamber 44 acts on feedback diaphragm 72 to result in a compressive force which tends to restore rod 64 to its original position. For reference purposes, FIG. 3 shows an exaggerated illustration of the micro-movement x of leg 16. The feedback compression against diaphragm 72 continues until the feedback force balances the electrical input force inducing the movement of magnetostrictive rod 64 to thereby establish an output pressure on fluid output port 50 which is proportional to the input current. Thus, bending of flexure element 10 towards or away from control nozzle end 54 changes the fluid output pressure on fluid output port 50 so as to change the pressure in nozzle chamber 44 acting against feedback diaphragm 72 and to change the resulting feedback force until the final fluid output pressure at port 50 is proportional to the electrical current value present at wires 70.

An alternative current to pressure transducer is shown in FIG. 4 wherein the prior feedback on diaphragm 72 has been eliminated. In the embodiment of FIG. 4, the supply pressure is coupled to a T-fitting 74 through a primary restrictor 76 and communicates with output line 78. In this embodiment the output pressure on line 78 is directly responsive to the input current value at wires 70. The output pressure in this case is more sensitive to the input, but, without feedback, is less linear and less precise compared to the current to pressure transducer of FIGS. 2, 3.

It is understood of course that in the illustrated bender element embodiment of FIG. 1, either leg 14 or 16 can be fixed in position while the other leg is moved so as to obtain the motion amplification and translation of small displacements. The flexure element 10 of the present invention is particularly useful when small, micron-sized displacements are generated by magnetostrictive, electrostrictive or piezoelectric devices. Such combinations find practical application in actuators and transducers, such as current to pressure transducers, electro-pneumatic relays, and control valve actuators.

Alternatively, both legs may be movable with respect to each other. Thus, for instance, if both legs are moved in the same direction there is no transverse displacement of the closed end; and if both legs are moved in opposite directions the closed end will be displaced in a transverse direction with amplified movement. Such a device may be utilized as a motion averaging or summing transducer unit wherein first and second inputs can be coupled to a respective leg and the input displacements generate amplified transverse movements of the free closed end corresponding to the difference between the two inputs.

Figure 10:
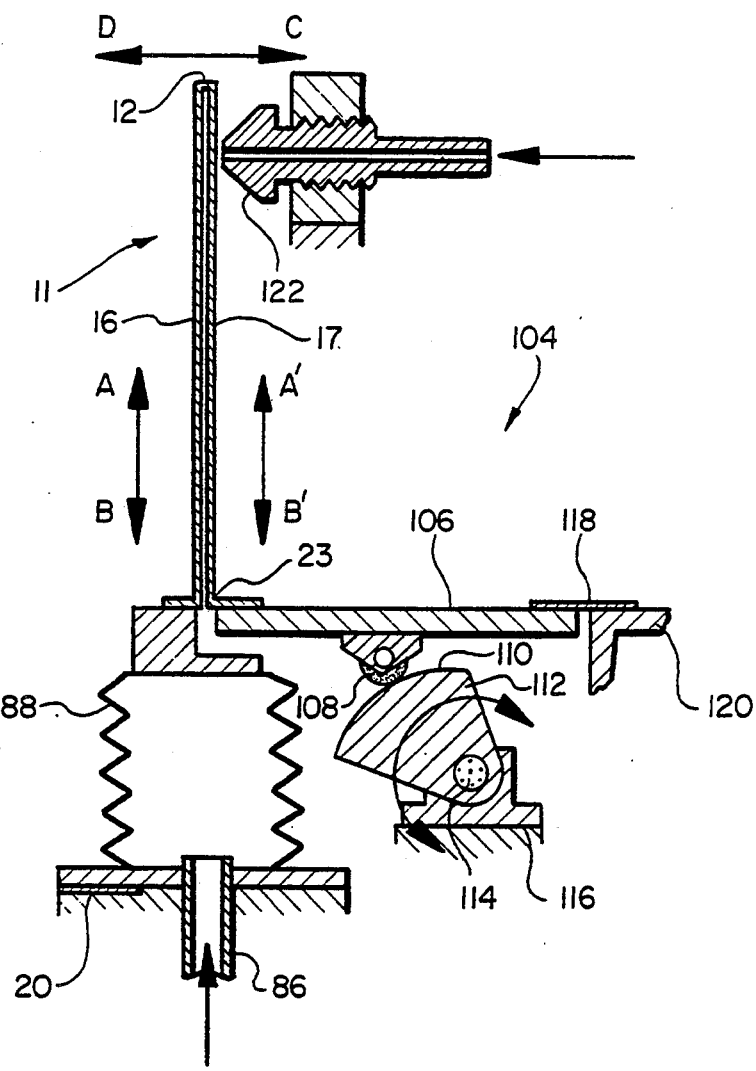
FIG. 10 illustrates an alternative flexure or bender device according to the invention.

Other application embodiments of a flexure or bender element in accordance with this aspect of the invention are illustrated in FIGS. 5–11. FIGS. 5–8 and 11 illustrate a flexure element in various applications using the motion amplification and translation features of such a flexure element; FIG. 9 illustrates a flexure element to attenuate large motions and provide precise smaller motions for positioning of surfaces or probes; and FIG. 10 illustrates a flexure element embodiment used to sum pressure and motion inputs.

Figure 5:
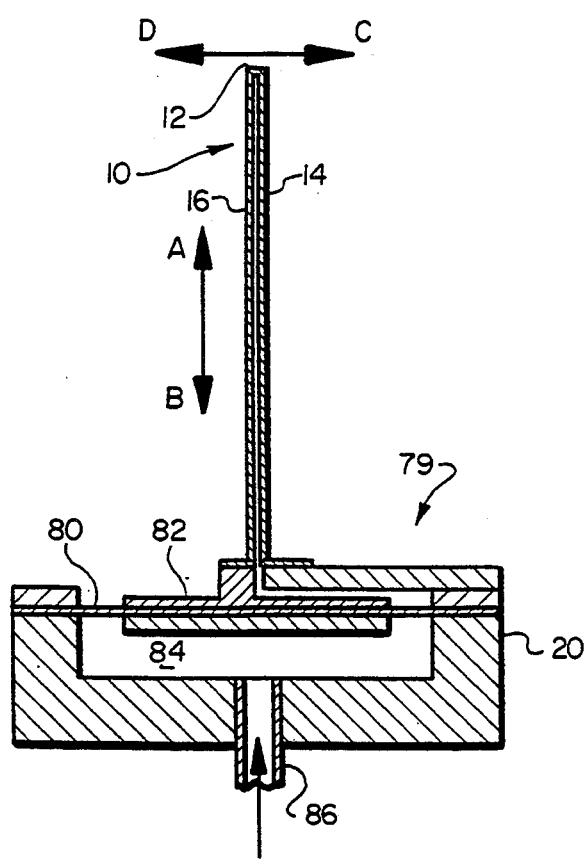

FIG. 5 illustrates an embodiment 79 having flexure or bender 10 with fixed leg 14 mounted to a stationery member such as fixed mounting block 20, and with moving leg 16 coupled to a diaphragm 80 through a connecting flange 82. The diaphragm is mounted in block 20 so as to provide an enclosed pressure chamber 84 receiving an input fluid pressure through an inlet 86. The pressure at inlet 86 and in chamber 84 acts on diaphragm 80 to move leg 16 in directions A or B to provide motion amplification and translation along respective directions C or D. Thus, the bender embodiment of FIG. 5 converts pressure to motion using a single diaphragm.

Figure 6:
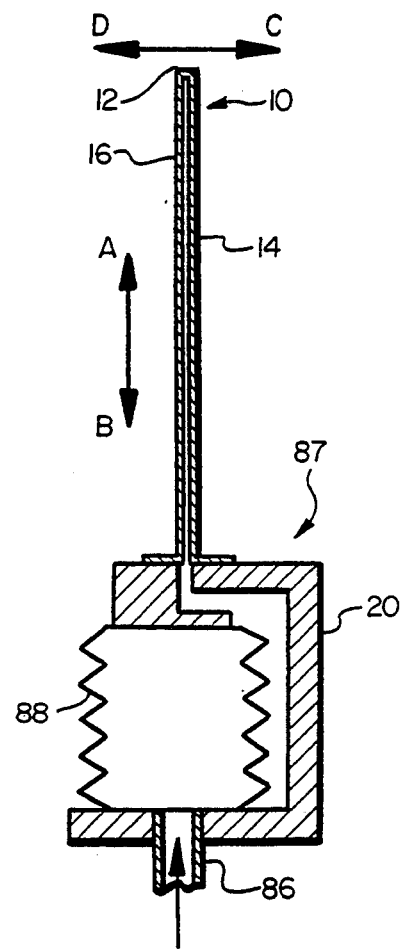

FIG. 6 illustrates another bender application embodiment 87 in which the bender element converts pressure to motion using a bellows 88 to which is coupled a fluid pressure through inlet 86. FIG. 7 illustrates another bender embodiment 89 which is responsive to both input fluid pressure on inlet 86 and input fluid pressure on inlet 90 and converts the output motion along respective directions C, D using a diaphragm stack. A first enclosed chamber 84 in fixed mounting block 20 is provided by diaphragm 80. A second chamber 92 is provided by diaphragm 94 wherein fluid pressure inlet 90 communicates with chamber 92.

FIG. 8 illustrates another embodiment 96 in which a flexure or bender element 10 is used to operate a spool valve 98. Fixed leg 14 is mounted to fixed mounting block 20 and moving leg 16 is connected through a suitable drive means to cause motion displacements along directions A, B. Closed end 12 is mounted to valve rod 100 to thereby move the valve members 101 along directions C, D in response to input motions A, B. Operating valve rod 100 along motion directions C, D, respectively couples the supply pressure in spool valve 98 to output pressure 1 or output pressure 2.

The flexure element application embodiment 102 of FIG. 9 provides motion attenuation rather than motion amplification. Fixed leg 14 is again mounted to a fixed mounting block 20. Movable leg 16 is mounted to a free end 103 of a flexible member 105 having the opposite end 107 fixed in position by mounting to a fixed mounting block 20. Typically, flexing or pivoting end 103 would include a special surface, probe, switch elements, or other devices utilizing the small output displacement in directions A, B of end 103 in response to large motion inputs in directions C, D at flexure element closed end 12. Accordingly, in this aspect of the invention, a bender element 10 is used to provide precise motion attenuation for precise positioning of laser mirrors, etc. on moving end 103.

Referring now to FIG. 10, there is illustrated an alternative application embodiment 104 using a bender element 11 with legs 16, 17 each of which is movable with respect to each other to provide an amplified translated motion along directions C, D. Moving leg 16 is mounted to bellows 88 receiving fluid pressure through inlet line 86. Longitudinal displacements along directions A, B are therefore in direct response to the pressure at inlet line 86. Movable leg 17 also may be displaced longitudinally along directions A', B' in response to a drive motion means connected to end 23 of leg 17. Thus, flexure element closed end 12 moves in directions C, D in response to the difference between the motion inputs to legs 16, 17.

For example, if the legs 16, 17 are moved in respective directions A, B', closed end 12 moves amplified transverse direction C. If the legs are moved in directions A', B, closed end 12 moves in direction D. If the legs are moved in respective directions A, A' or B, B', closed end 12 does not move in the transverse direction.

In the example of embodiment 104 shown in FIG. 10, leg 17 is displaced by means of the movements of a platform 106 having a rotating wheel 108 in contact with cam surface 110 of an eccentric cam 112. Eccentric cam 112 is fixed to and driven by a rotatable shaft 114 which is rotatably mounted in a fixed frame 116. Thus, as shaft 114 is rotated in the indicated clockwise or counter-clockwise directions, eccentric cam 12 is rotated to move plate 106 upwardly or downwardly, thereby providing the displacement motions of leg 17 along directions A', B'. A hinge member 118 may be used to connect plate 106 to a fixed frame 120.

Nozzle 122 is mounted adjacent closed end 12 and is supplied with a fluid flow. Thus, the fluid flow and pressure at nozzle 122 is controlled by the movement of closed end 12 in directions C, D. In the illustration of embodiment 104 shown in FIG. 10, bender element 11 is responsive to the pressure at input 86 and the motion input on shaft 114. Embodiment 104 therefore has applications in the construction of process controllers and valve positioners.

Figure 11:
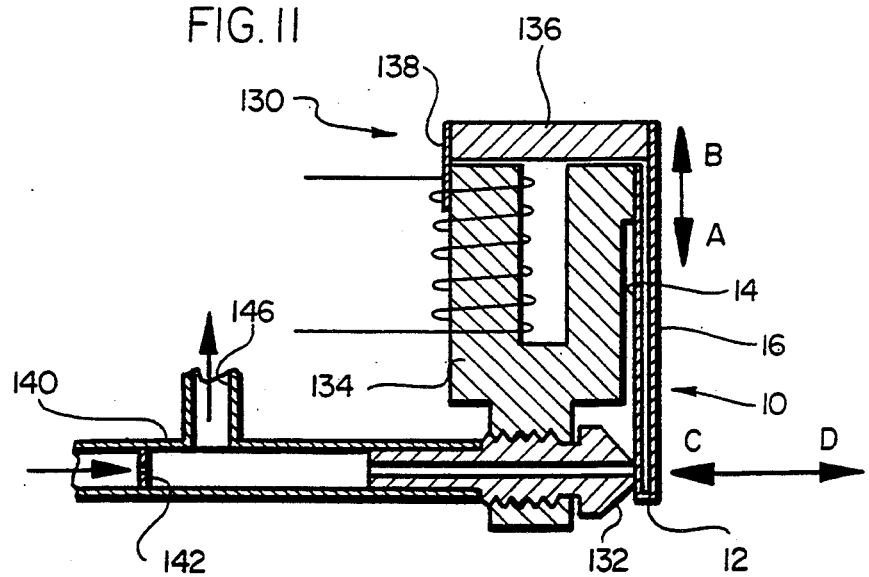
FIG. 11 illustrates another alternative application utilizing the flexure device of FIG. 1.

FIG. 11 illustrates another embodiment 130 comprising a proportional solenoid current to pressure transducer. Embodiment 130 includes a bender element 10 for converting an electric current into a variable flow rate from nozzle outlet 132 using a solenoid 134. Fixed leg 14 is mounted to a rigid, fixed portion of solenoid 134. Displaceable leg 16 is mounted to a free end of solenoid armature 136 with the other end being hingedly mounted to the solenoid by hinge means 138.

A source of pneumatic pressure is coupled to a T-fitting 140 through a fixed metering orifice or primary restrictor 142 and communicates with output line 146.

In operation, the proportional current to pressure transducer makes use of the flexure 10 to minimize the amount of travel required of the solenoid's armature. Reduced armature travel allows the solenoid to be designed to operate in a stable region and therefore act in a proportional manner in response to changes in electrical current rather than the snap acting manner commonly associated with solenoid operation. The solenoid armature 136 slowly moves towards and away from the solenoid 134 in response to the input solenoid coil current due to the stiffness of element 10. These small motion displacements along directions A, B are translated into amplified displacements C, D of closed end 12 to provide a variable flow rate from nozzle 132. This embodiment eliminates the hysteresis due to pivots, bearings, etc. commonly encountered in other transducer designs.

The foregoing detailed description has been given for clearness of understanding only, and no unnecessary limitations should be understood therefrom, as modifications will be obvious to those skilled in the art.

We claim:

1. An electromechanical transducer providing a fluid output pressure proportional to an electrical input signal comprising:

respective fluid pressure input and output ports and an interconnecting chamber;

nozzle means including a nozzle with (1) a control nozzle end, and (2) an opposite nozzle inlet communicating with said interconnecting chamber between said respective fluid pressure input and output ports;

a U-shaped flexure element having a closed end and two legs extending therefrom with the closed end immediately above the control nozzle end;

movable means coupled to one of the U-shaped flexure element legs for moving said one leg with respect to the other leg and enabling the U-shaped flexure element to selectively bend towards or away from said control nozzle end, said movable means including electrical drive means for responding to said electrical input signal and actuating said movable means;

said movable means including a magnetostrictive element and a magnetic core connected intermediate the flexure element and the magnetostrictive element;

said bending of the U-shaped flexure element towards or away from said control nozzle end changes the fluid output pressure from said fluid output port responsive to changes in said electrical input signal.

2. An electromechanical transducer according to claim 1, wherein said electrical drive means includes a coil surrounding said magnetostrictive element and having an input for receiving said electrical input signal.

* * * * *

UNITED STATES PATENT AND TRADEMARK OFFICE
CERTIFICATE OF CORRECTION

PATENT NO. : 5,381,817
DATED : January 17, 1995
INVENTOR(S) : GEORGE W. GASSMAN, ET AL.

It is certified that error appears in the above-identified patent and that said Letters Patent is hereby corrected as shown below:

Title page: change item [63]
"Pat. No. 5,163,461" to --Pat. No. 5,163,463--.

Title page: change item [57], line 11,
"thereform" to --therefrom--.

Col. 6, line 14,
change "stainless steel" to --316 stainless steel--.

Signed and Sealed this

Fifth Day of September, 1995

*Attest:*

BRUCE LEHMAN

*Attesting Officer*  *Commissioner of Patents and Trademarks*